(12) United States Patent
Goto et al.

(10) Patent No.: US 8,084,831 B2
(45) Date of Patent: Dec. 27, 2011

(54) SEMICONDUCTOR DEVICE (75) Inventors: Masakazu Goto, Kanagawa (JP); Shigeru Kawanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 12/540,679

(22) Filed: Aug. 13, 2009

(65) Prior Publication Data
US 2010/0072554 A1 Mar. 25, 2010

(30) Foreign Application Priority Data
Sep. 19, 2008 (JP) .................. 2008-241345

(51) Int. Cl.
*H01L 27/088* (2006.01)
(52) U.S. Cl. ........ 257/394; 257/395; 257/396; 257/408; 257/E21.435
(58) Field of Classification Search .................. 257/396, 257/395, 394, 368, 288, 408, E21.435, 365
See application file for complete search history.

(56) References Cited

U.S. PATENT DOCUMENTS

| 2009/0206416 A1* | 8/2009 | Cheng et al. ................. 257/369 |
| 2010/0237445 A1* | 9/2010 | Shima ........................... 257/412 |

OTHER PUBLICATIONS

P.D. Kirsch, et al., "Band Edge n-MOSFETs with High-k/Metal Gate Stacks Scaled to EOT=0.9nm with Excellent Carrier Mobility and High Temperature Stability", IEEE IEDM Tech Digest, 2006, 4 pages.

F. Andrieu, et al., "Comparative Scalability of PVD and CVD TiN on $HfO_2$ as a Metal Gate Stack for FDSOI cMOSFETs down to 25nm Gate Length and Width", IEEE IEDM Tech Digest, 2006, 4 pages.
Takeo Matsuki, et al., "Impact of Gate Metal-Induced Stress on Performance Modulation in Gate-Last Metal-Oxide-Semiconductor Field-Effect Transistors", Japanese Journal of Applied Physics, vol. 46, No. 5B, 2007, pp. 3181-3184.

* cited by examiner

*Primary Examiner* — Evan Pert
*Assistant Examiner* — Scott R Wilson
(74) *Attorney, Agent, or Firm* — Oblon, Spivak, McClelland, Maier & Neustadt, L.L.P.

(57) ABSTRACT

A semiconductor device according to one embodiment includes: an n-type transistor comprising a first gate electrode formed on a semiconductor substrate via a first gate insulating film, a first channel region formed in the semiconductor substrate under the first gate insulating film, and first source/drain regions formed in the semiconductor substrate on both sides of the first channel region, the first gate electrode comprising a first metal layer and a first conductive layer thereon; and a p-type transistor comprising a second gate electrode formed on the semiconductor substrate via a second gate insulating film, a second channel region formed in the semiconductor substrate under the second gate insulating film, and second source/drain regions formed in the semiconductor substrate on both sides of the second channel region, the second gate electrode comprising a second metal layer and a second conductive layer thereon, the second metal layer being thicker than the first metal layer and having the same constituent element as the first metal layer.

20 Claims, 9 Drawing Sheets

FIG. 8

SEMICONDUCTOR DEVICE

CROSS-REFERENCE TO RELATED APPLICATIONS

This application is based upon and claims the benefit of priority from prior Japanese Patent Application No. 2008-241345, filed on Sep. 19, 2008, the entire contents of which are incorporated herein by reference.

BACKGROUND

In recent years, miniaturization of a MISFET (Metal Insulator Semiconductor Field Effect Transistor) is proceeding according to the requirements for downsizing electronic devices, and an associated requirement for a thinning of a gate insulating film is remarkable. However, since a problem of depletion of a polycrystalline silicon gate electrode occurs in accordance with the thinning of the gate insulating film, a technique using a metal gate electrode is used in order to avoid this problem.

In a semiconductor device mounting n-type and p-type MISFETs together, it is required that each of them has appropriate threshold voltage. However, when a metal gate electrode is used, unlike the case of using a polycrystalline silicon gate electrode, it is not possible to use a method in which an impurity is introduced into a gate electrode for adjusting a work function thereof.

As a method of adjusting threshold voltage of a MISFET using a metal gate electrode, a technique is known in which an impurity such as La, etc., is implanted into a gate insulating film, however, a problem that carrier mobility is decreased due to impurity implantation is known. The method, for example, is disclosed in a non-patent literary document of P. D. Kirsch et al., IEDM, 2006, p. 629.

On the other hand, a technique is known in which a metal gate electrode is formed so as to include a stress for generating a strain in a channel region of a MISFET, thereby modulating carrier mobility. This technique, for example, is disclosed in a non-patent literary document of F. Andrieu et al., IEDM Tech. Dig., 2006, p. 641.

In addition, a technique is known in which a direction of an included stress is adjusted by changing a film formation method. This technique, for example, is disclosed in a non-patent literary document of Takeo Matsuki et al., Japanese Journal of Applied Physics, Vol. 46, No. 5B, 2007, p. 3181. According to the technique described in this non-patent literary document, plural metal gates having different directions of the stress included therein can be made of one material. In detail, it is possible to include a tensile stress by forming a metal gate electrode using a CVD (Chemical Vapor Deposition) method, and to include a compressive stress by forming a metal gate electrode using a PVD (Physical Vapor Deposition) method.

BRIEF SUMMARY

A semiconductor device according to one embodiment includes: an n-type transistor comprising a first gate electrode formed on a semiconductor substrate via a first gate insulating film, a first channel region formed in the semiconductor substrate under the first gate insulating film, and first source/drain regions formed in the semiconductor substrate on both sides of the first channel region, the first gate electrode comprising a first metal layer and a first conductive layer thereon; and a p-type transistor comprising a second gate electrode formed on the semiconductor substrate via a second gate insulating film, a second channel region formed in the semiconductor substrate under the second gate insulating film, and second source/drain regions formed in the semiconductor substrate on both sides of the second channel region, the second gate electrode comprising a second metal layer and a second conductive layer thereon, the second metal layer being thicker than the first metal layer and having the same constituent element as the first metal layer.

DETAILED DESCRIPTION

First Embodiment

Figure 1:
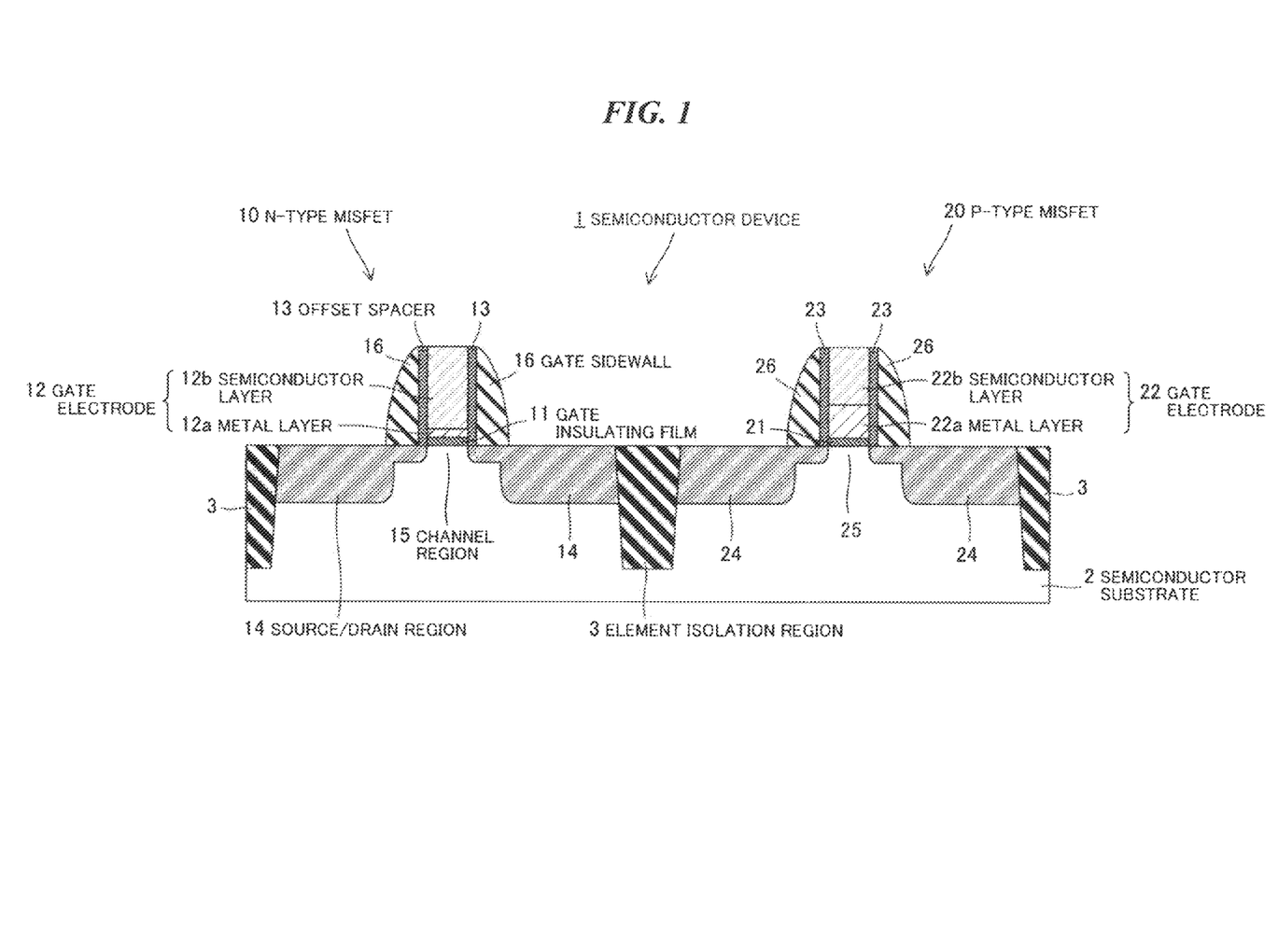
FIG. 1 is a cross sectional view showing a semiconductor device according to a first embodiment.

FIG. 1 is a cross sectional view showing a semiconductor device 1 according to a first embodiment. The semiconductor device 1 has an n-type MISFET 10 and a p-type MISFET 20 on a semiconductor substrate 2. The n-type MISFET 10 and the p-type MISFET 20 are electrically isolated by an element isolation region 3.

The semiconductor substrate 2 is made of a Si-based crystal such as a Si crystal, etc.

The element isolation region 3 is made of, e.g., an insulating material such as $SiO_2$, etc., and has a STI (Shallow Trench Isolation) structure.

The n-type MISFET 10 has a gate electrode 12 formed on the semiconductor substrate 2 via a gate insulating film 11, offset spacers 13 formed on side faces of the gate electrode 12, gate sidewalls 16 formed on side faces of the offset spacers 13, a channel region 15 formed in the semiconductor substrate 2 under the gate insulating film 11, and source/drain regions 14 formed in the semiconductor substrate 2 on both sides of the channel region 15. Note that, although it is not shown in the figures, a p-type well may be formed in a region in the semiconductor substrate 2 below the n-type MISFET 10.

The p-type MISFET 20 has a gate electrode 22 formed on the semiconductor substrate 2 via a gate insulating film 21, offset spacers 23 formed on side faces of the gate electrode 22, gate sidewalls 26 formed on side faces of the offset spacers 23, a channel region 25 formed in the semiconductor substrate 2 under the gate insulating film 21, and source/drain regions 24 formed in the semiconductor substrate 2 on both sides of the channel region 25. Note that, although it is not shown in the figures, an n-type well may be formed in a region in the semiconductor substrate 2 below the p-type MISFET 20.

The gate insulating films 11 and 21 are made of, e.g., an insulating material such as $SiO_2$, SiN or SiON, etc., or a high-k material such as an Hf-based compound (HfSiON, HfSiO or HfO, etc.), a Zr-based compound (ZrSiON, ZrSiO or ZrO, etc.) or a Y-based compound ($Y_2O_3$, etc.). In addition, an impurity such as La, Mg, Al or Ge, etc., may be contained in the above-mentioned materials in order to adjust threshold voltage of the n-type MISFET 10 and the p-type MISFET 20. In this case, the gate insulating films 11 and 21 may contain different impurities, or only one of the gate insulating films 11 and 21 may contain an impurity.

The gate electrode 12 includes a metal layer 12a formed on the gate insulating film 11 and a semiconductor layer 12b formed on the metal layer 12a. Meanwhile, the gate electrode 22 includes a metal layer 22a formed on the gate insulating film 21 and a semiconductor layer 22b formed on the metal layer 22a.

The metal layers 12a and 22a have a function as a metal gate for preventing depletion of the gate electrodes 12 and 22. The metal layers 12a and 22a are made of, e.g., Ti, Ta, W, Mo or Ru, a nitride thereof or a carbide thereof, and further, a compound of those metals with Si (TiN, TaSiN or TaC, etc.). The metal layer 22a is thicker than the metal layer 12a.

Figure 2:
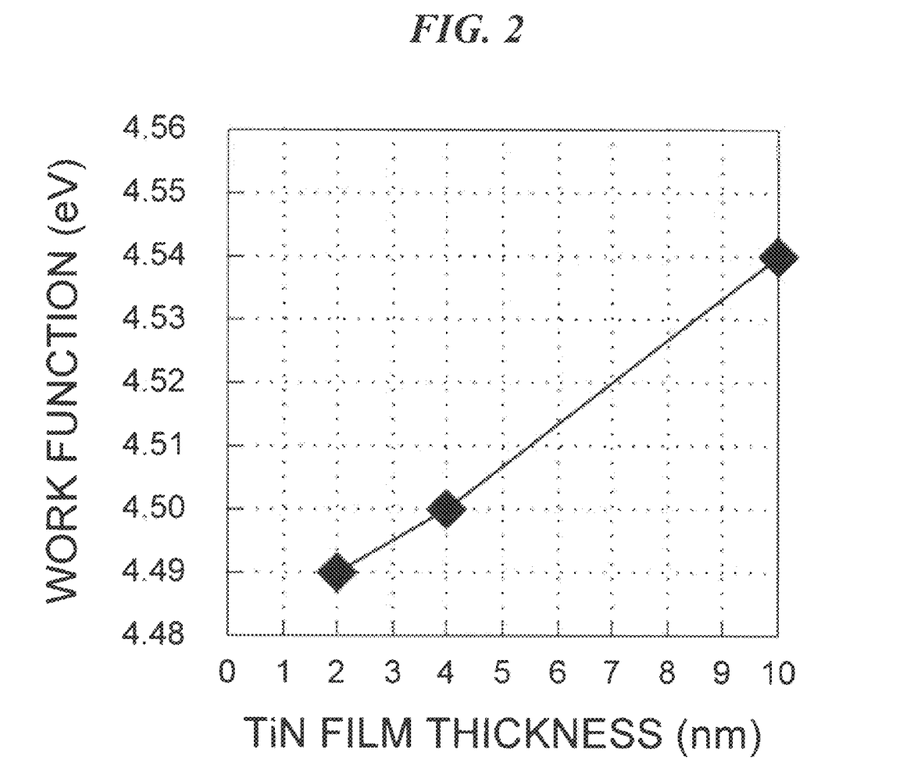
FIG. 2 is a graph showing a relation between a film thickness and a work function of a metal layer.

FIG. 2 is a graph showing a relation between a film thickness and a work function of a metal layer. As for each film formation condition of metal layers having different film thicknesses in FIG. 2, only film formation time is different and other conditions are the same. As shown in FIG. 2, a work function of a metal layer increases with increasing a film thickness thereof. The reason for this is considered that, for example, since composition and orientation of a metal is different at the early stage and at the later stage of a film formation process of a metal layer, a difference in composition and orientation is generated between metal layers having different film thicknesses.

Note that, although FIG. 2 shows a relation between a thickness and a work function of a metal layer made of, e.g., TiN formed by a sputtering method, a material and a film formation method of a metal layer satisfying this relation are not limited thereto. In addition, when a metal layer made of a compound such as TiN, TaSiN or TaC, etc., is formed, a composition ratio of a film may change from the early stage to the later stage of the film formation process. Therefore, although a composition ratio of a material may be different between metal layers having different thicknesses, constituent elements of the material are the same.

Since the work function of Si as a material of the semiconductor substrate 2 at the lower limit of the conduction band is about 4.1 eV and the work function at the upper limit of the valence band is about 5.1 eV, the metal layer having the smaller work function (closer to 4.1 eV) is more suitable for an n-type MISFET, and the metal layer having the larger work function (closer to 5.1 eV) is more suitable for a p-type MISFET.

From the above-mentioned reason, a thin metal layer 12a has a small work function which is suitable for an n-type MISFET, and a thick metal layer 22a has a large work function which is suitable for a p-type MISFET.

In addition, the metal layers 12a and 22a are made of the same material (when composed of a single element or a compound having the same compound ratio) or a material having the same constituent elements (when composed of a compound having a different compound ratio). Therefore, a relation between the film thickness and the work function is substantially equal between the metal layers 12a and 22a, hence, adjustment of the work function of the both metal layers 12a and 22a is facilitated.

A thickness of the metal layer 12a is preferably 2 nm or more in order to sufficiently ensure a function as a metal gate. In addition, the metal layer 22a is preferably 5 nm or more thicker than the metal layer 12a so that the metal layers 12a and 22a have work functions respectively suitable for the n-type MISFET 10 and the p-type MISFET 20.

Alternatively, when it is not possible to obtain desired threshold voltage only by adjusting the work function by controlling film thicknesses of the metal layers 12a and 22a, the threshold voltage may be compensatingly adjusted by other methods, such as implantation of an impurity such as La, Mg, Al or Ge, etc., into the gate insulating films 11 and 21. Also in this case, since it is possible to bring the threshold voltage closer to the desired value by controlling the film thickness, it is possible to reduce deterioration in operating characteristics of the n-type MISFET 10 and the p-type MISFET 20 caused by the other method (e.g., a decrease in carrier mobility caused by implantation of an impurity into the gate insulating films 11 and 21).

The semiconductor layers 12b and 22b are made of a Si-based polycrystal such as polycrystalline Si or polycrystalline Ge, etc., containing a conductivity type impurity. An n-type impurity such as As or P, etc., is contained in the semiconductor layer 12b, and a p-type impurity such as B or $BF_2$, etc., is contained in the semiconductor layer 22b. In addition, silicide layers may be formed in upper portions or the whole of the semiconductor layers 12b and 22b.

By forming the semiconductor layers 12b and 22b in the upper portion of the gate electrodes 12 and 22, respectively, it is possible to improve consistency with a conventional polycrystalline Si gate electrode process. In addition, since the metal layer 12a has a thickness different from the metal layer 22a, it is possible to equalize heights of the gate electrodes 12 and 22 by adjusting the thicknesses of the semiconductor layers 12b and 22b.

The offset spacers 13 and 23 are made of, e.g., an insulating material such as $SiO_2$ or SiN, etc. The thicknesses of the offset spacers 13 and 23 are factors for determining positions of edges of the source/drain regions 14 and 24 on the channel regions 15 and 25 sides, respectively.

The gate sidewalls 16 and 26 may have a single layer structure comprising, e.g., SiN, or a structure of two layers comprising, e.g., SiN and $SiO_2$, furthermore, may have a structure of three or more layers.

The source/drain region 14 is formed by implanting an n-type impurity such as As or P, etc., into the semiconductor substrate 2 in a region of the n-type MISFET 10. Meanwhile, the source/drain region 24 is formed by implanting a p-type impurity such as B or $BF_2$, etc., into the semiconductor substrate 2 in a region of the p-type MISFET 20. In addition, silicide layers may be formed on upper portions of the source/drain regions 14 and 24.

An example of a method of fabricating a semiconductor device 1 according to the present embodiment will be described hereinafter.

FIGS. 3A to 3H are cross sectional views showing processes for fabricating the semiconductor device 1 according to the first embodiment.

Figure 3A:
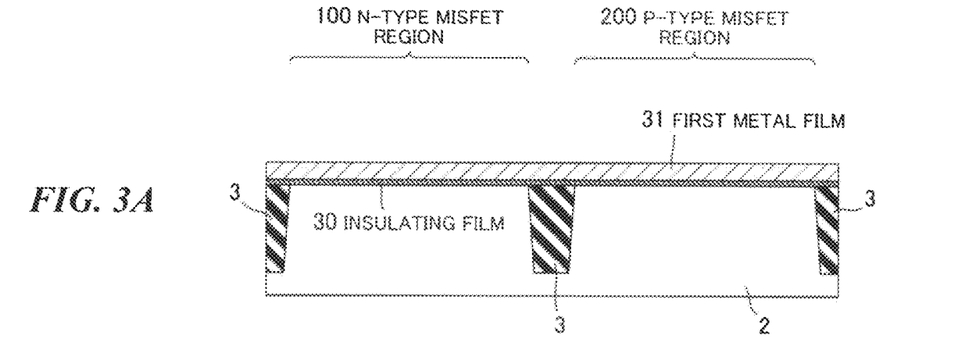
FIGS. 3A to 3H are cross sectional views showing processes for fabricating the semiconductor device according to the first embodiment.

Firstly, as shown in FIG. 3A, after isolating an n-type MISFET region 100 for forming the n-type MISFET 10 from a p-type MISFET region 200 for forming the p-type MISFET 20 by forming the element isolation region 3 on the semiconductor substrate 2, an insulating film 30 and a first metal film 31 are laminated on the n-type MISFET region 100 and the p-type MISFET region 200.

Here, the element isolation region 3 is formed by, e.g., following process. Firstly, a trench is formed in the semiconductor substrate 2 by a photolithography method and a RIE (Reactive Ion Etching) method. Next, a SiO$_2$ film is deposited in the trench by a CVD (Chemical Vapor Deposition) method, and is substantially planarized by a CMP (Chemical Mechanical Polishing) method, thereby processing into the element isolation region 3.

In addition, although it is not shown in the figures, after forming the element isolation region 3, a conductivity type impurity is implanted into the semiconductor substrate 2 by an ion implantation procedure for forming a well (not shown) in each of the n-type MISFET region 100 and the p-type MISFET region 200. Here, a p-type impurity such as B, etc., is implanted in the n-type MISFET region 100 and an n-type impurity such as P, etc., is implanted in the p-type MISFET region 200. The conductivity type impurity in the well is activated by heat treatment such as a RTA (Rapid Thermal Annealing) method, etc.

The insulating film 30 is formed by the CVD method or a plasma nitriding method, etc. Meanwhile, the first metal film 31 is formed by a PVD (Physical Vapor Deposition) method, etc. The first metal film 31 is a film to be processed into the metal layer 22a in a posterior process.

Figure 3B:
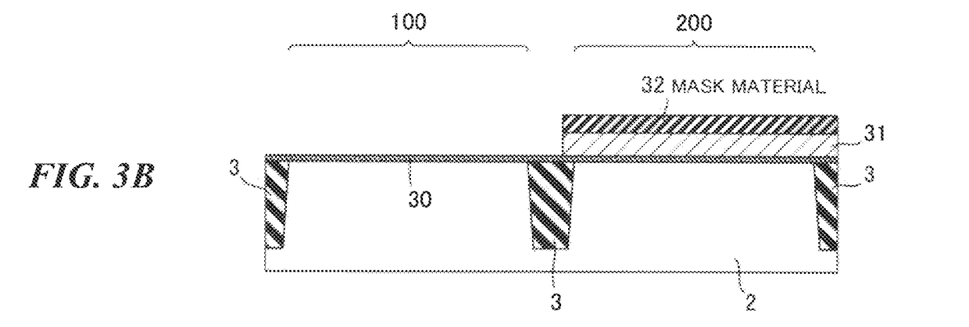

Next, as shown in FIG. 3B, the first metal film 31 is etched using a mask material 32 formed on the first metal film 31 in the p-type MISFET region 200 as a mask, thereby removing the first metal film 31 in the n-type MISFET region 100.

Here, the mask material 32 is formed by the photolithography method. In addition, the first metal film 31 in the n-type MISFET region 100 is removed by a wet etching method, etc., using the mask material 32 as a mask.

Figure 3C:
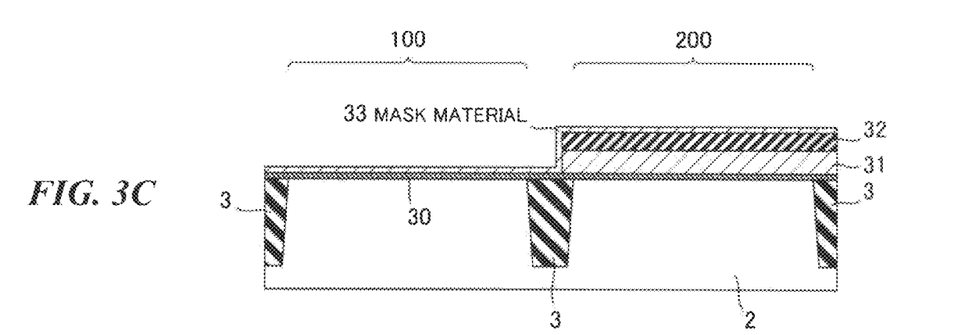

Next, as shown in FIG. 3C, a second metal film 33 is formed on the insulating film 30 in the n-type MISFET region 100 and on the mask material 32 in the p-type MISFET region 200.

The second metal film 33 is formed by the PVD method, etc. Since the second metal film 33 is a film to be processed into the metal layer 12a in a posterior process, the second metal film 33 is formed thinner than the first metal film 31.

Figure 3D:
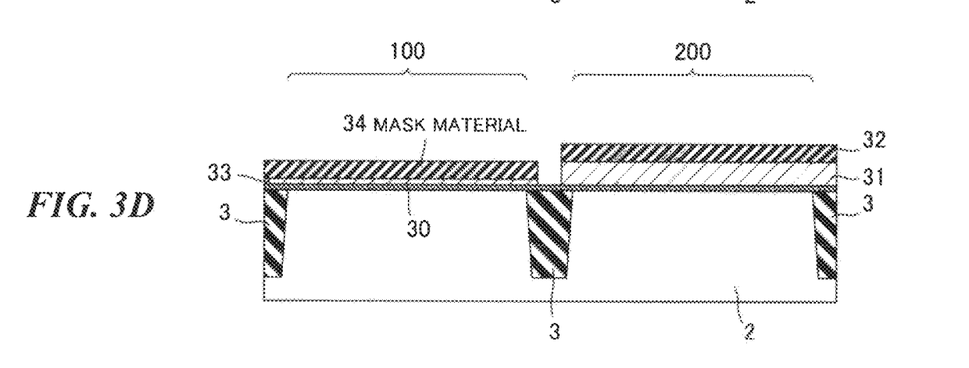

Next, as shown in FIG. 3D, the second metal film 33 is etched using a mask material 34 formed on the second metal film 33 in the n-type MISFET region 100 as a mask, thereby removing the second metal film 33 in the p-type MISFET region 200.

Here, the mask material 34 is formed by the photolithography method. In addition, the second metal film 33 in the p-type MISFET region 200 is removed by the wet etching method, etc., using the mask material 34 as a mask.

Figure 3E:
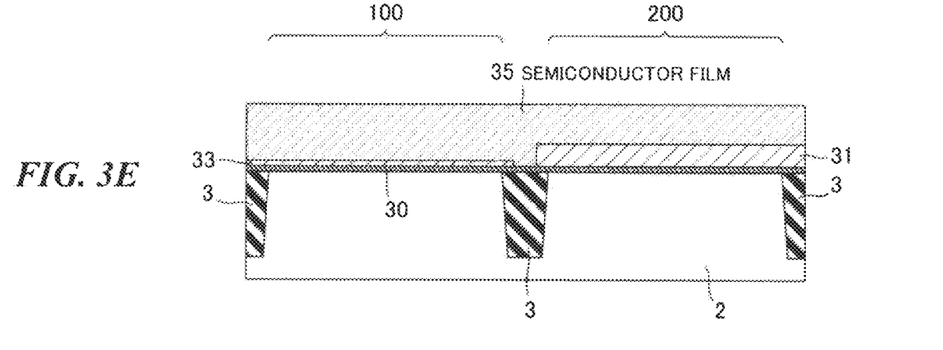

Next, as shown in FIG. 3E, after removing the mask materials 32 and 34, a semiconductor film 35 is formed on the second metal film 33 in the n-type MISFET region 100 and on the first metal film 31 in the p-type MISFET region 200.

Here, the mask materials 32 and 34 are removed by the wet etching method, etc. In addition, the semiconductor film 35 is formed by the CVD method, etc.

Figure 3F:
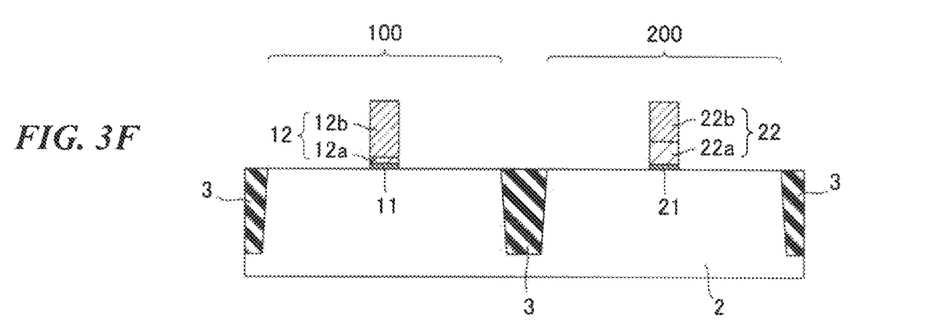

Next, as shown in FIG. 3F, the semiconductor film 35, the first metal film 31, the second metal film 33 and the insulating film 30 are patterned, which results in that the semiconductor layer 12b, the metal layer 12a and the gate insulating film 11 are formed in the n-type MISFET region 100, and that the semiconductor layer 22b, the metal layer 22a and the gate insulating film 21 are formed in the p-type MISFET region 200. Note that, the gate electrode 12 is composed of the metal layer 12a and the semiconductor layer 12b, and the gate electrode 22 is composed of the metal layer 22a and the semiconductor layer 22b.

Here, the semiconductor film 35, the first metal film 31, the second metal film 33 and the insulating film 30 are patterned by, e.g., the photolithography method and the RIE method. As a result of the patterning, the semiconductor film 35 is shaped into the semiconductor layers 12b and 22b, the first metal film 31 is shaped into the metal layer 22a, the second metal film 33 is shaped into the metal layer 12a, and the insulating film 30 is shaped into the gate insulating films 11 and 21.

Figure 3G:
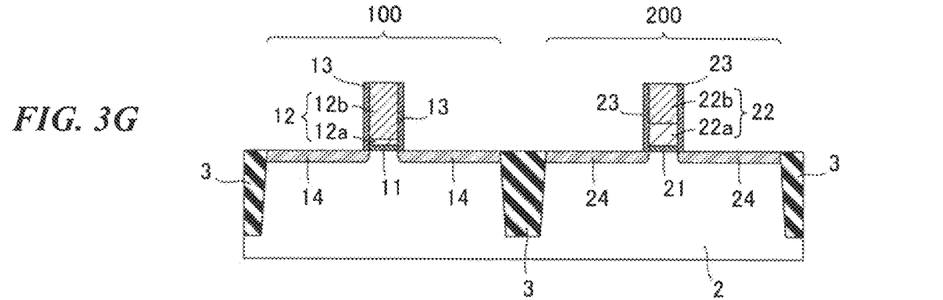

Next, as shown in FIG. 3G, after respectively forming the offset spacers 13 and 23 on side faces of the gate insulating film 11 and the gate electrode 12 and on side faces of the gate insulating film 21 and the gate electrode 22, extension regions of the source/drain regions 14 and 24 are respectively formed in the n-type MISFET region 100 and the p-type MISFET region 200. The conductivity type impurities in the extension regions of the source/drain regions 14 and 24 are activated by heat treatment such as the RTA method, etc.

Here, a material film of the offset spacers 13 and 23 is formed by, e.g., the CVD method, etc., so as to cover the whole surface of the semiconductor substrate 2, and is subsequently shaped by the RIE method, etc., which results in that the offset spacers 13 and 23 are formed.

The extension regions of the source/drain regions 14 are formed by implanting an n-type impurity into the semiconductor substrate 2 in the n-type MISFET region 100 by the ion implantation procedure, etc., using the gate electrode 12 and the offset spacer 13 as a mask. Meanwhile, the extension regions of the source/drain regions 24 are formed by implanting a p-type impurity into the semiconductor substrate 2 in the p-type MISFET region 200 by the ion implantation procedure, etc., using the gate electrode 22 and the offset spacer 23 as a mask.

Figure 3H:
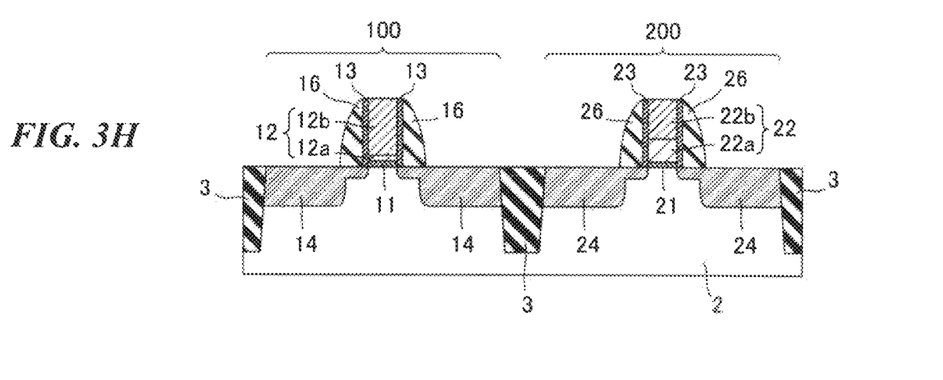

Next, as shown in FIG. 3H, after respectively forming the gate sidewalls 16 and 26 on side faces of the offset spacers 13 and 23, the source/drain regions 14 and 24 are respectively formed in the n-type MISFET region 100 and the p-type MISFET region 200. The conductivity type impurities in the source/drain regions 14 and 24 are activated by heat treatment such as the RTA method, etc.

Here, a material film of the gate sidewalls 16 and 26 is formed by, e.g., the CVD method, etc., so as to cover the whole surface of the semiconductor substrate 2, and is subsequently shaped by the RIE method, etc., which results in that the gate sidewalls 16 and 26 are formed.

The source/drain regions 14 are formed by implanting an n-type impurity into the semiconductor substrate 2 in the n-type MISFET region 100 by the ion implantation procedure, etc., using the gate electrode 12, the offset spacers 13 and the gate sidewalls 16 as a mask. Meanwhile, the source/drain regions 24 are formed by implanting a p-type impurity into the semiconductor substrate 2 in the p-type MISFET region 200 by the ion implantation procedure, etc., using the gate electrode 22, the offset spacers 23 and the gate sidewalls 26 as a mask.

Effect of the First Embodiment

According to the first embodiment, by differentiating the film thickness of the metal layer 12a from that of the metal layer 22a, it is possible to differentiate the work function of each layer. As a result, it is possible to set threshold voltage respectively suitable for the n-type MISFET 10 and the p-type MISFET 20.

In addition, since it is possible to reduce application of other threshold voltage adjustment methods even in the case that it is not possible to obtain the desired threshold voltage only by adjusting the work function by controlling film thicknesses of the metal layers 12a and 22a, it is possible to reduce deterioration in operating characteristics of the n-type MIS- FET 10 and the p-type MISFET 20 caused by the other threshold voltage adjustment methods.

Second Embodiment

The second embodiment is different from the first embodiment in that the n-type MISFET 10 has two laminated metal layers. Note that, the explanations will be omitted or simplified for other points which are the same as the first embodiment.

Figure 4:
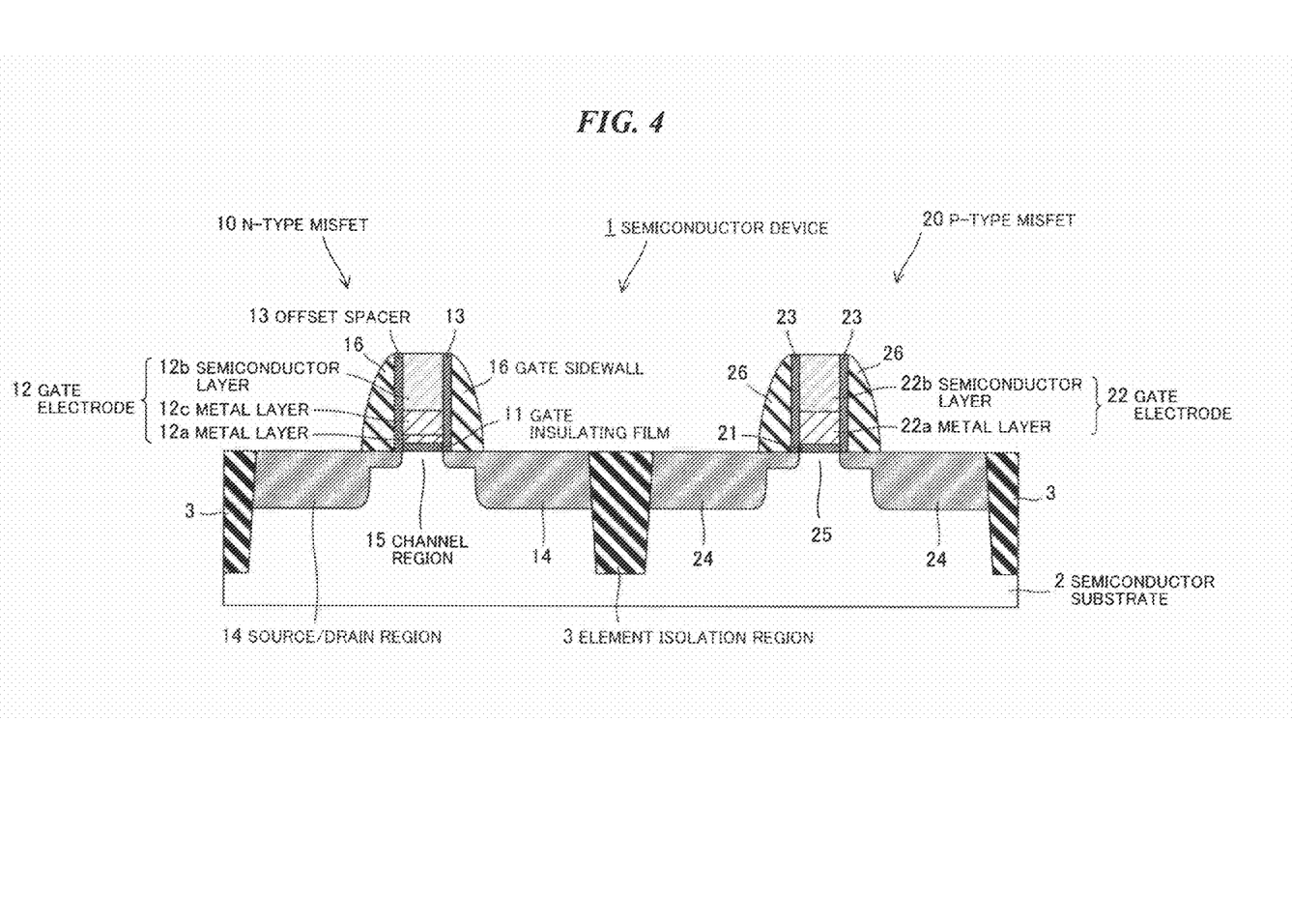
FIG. 4 is a cross sectional view showing a semiconductor device according to a second embodiment.

FIG. 4 is a cross sectional view showing a semiconductor device 1 according to a second embodiment.

The gate electrode 12 includes a metal layer 12a formed on the gate insulating film 11, a metal layer 12c formed on the metal layer 12a and a semiconductor layer 12b formed on the metal layer 12c. Meanwhile, the gate electrode 22 includes a metal layer 22a formed on the gate insulating film 21 and a semiconductor layer 22b formed on the metal layer 22a.

The metal layers 12a and 22a have a function as a metal gate for preventing depletion of the gate electrodes 12 and 22. The metal layers 12a, 12c and 22a are made of the same material or a material having the same constituent elements, and are made of, e.g., Ti, Ta, W, Mo or Ru, a nitride thereof or a carbide thereof, and further, a compound of those metals with Si (TiN, TaSiN or TaC, etc.).

The metal layer 22a is thicker than the metal layer 12a, and for the same reason as the first embodiment, the work function of the metal layer 22a is larger than that of the metal layer 12a. In addition, a sum of thicknesses of the metal layers 12a and 12c is substantially equal to a thickness of the metal layer 22a.

Comparing between the metal layers 12a and 12c, the threshold voltage of the n-type MISFET 10 is largely affected by the work function of the metal layer 12a which is an underlying layer. Thus, the threshold voltage suitable for an n-type MISFET is provided to the n-type MISFET 10 by the gate electrode 12 including the thin metal layer 12a, and the threshold voltage suitable for a p-type MISFET is provided to the p-type MISFET 20 by the gate electrode 22 including the thick metal layer 22a.

A thickness of the metal layer 12a is preferably 2 nm or more in order to sufficiently ensure a function as a metal gate. In addition, the metal layer 22a is preferably 5 nm or more thicker than the metal layer 12a so that the metal layers 12a and 22a have work functions respectively suitable for the n-type MISFET 10 and the p-type MISFET 20.

Alternatively, when it is not possible to obtain desired threshold voltage only by adjusting the work function by controlling film thicknesses of the metal layers 12a and 22a, the threshold voltage may be compensatingly adjusted by other methods, such as implantation of an impurity such as La, Mg, Al or Ge, etc., into the gate insulating films 11 and 21. Also in this case, since it is possible to bring the threshold voltage closer to the desired value by controlling the film thickness, it is possible to reduce deterioration in operating characteristics of the n-type MISFET 10 and the p-type MISFET 20 caused by the other method (e.g., a decrease in carrier mobility caused by implantation of an impurity into the gate insulating films 11 and 21).

Note that, the metal layer 12c may be composed of a multilayer metal film.

An example of a method of fabricating a semiconductor device 1 according to the present embodiment will be described hereinafter.

FIGS. 5A to 5D are cross sectional views showing processes for fabricating the semiconductor device 1 according to the second embodiment.

Firstly, the processes until the process, shown in FIG. 3C, for forming the second metal film 33 are carried out in the same way as the first embodiment.

Figure 5A:
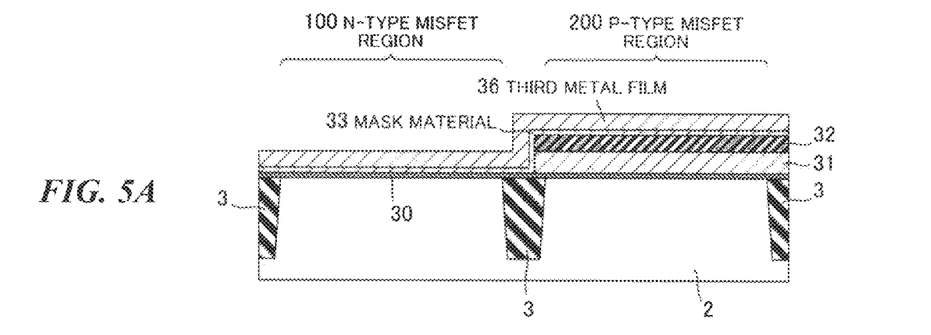
FIGS. 5A to 5D are cross sectional views showing processes for fabricating the semiconductor device according to the second embodiment.

Next, as shown in FIG. 5A, a third metal film 36 is formed on the second metal film 33.

The third metal film 36 is formed by the PVD method, etc. The third metal film 36 is formed such that a sum of thicknesses of the second metal film 33 and the third metal film 36 is equal to a thickness of the first metal film 31.

Figure 5B:
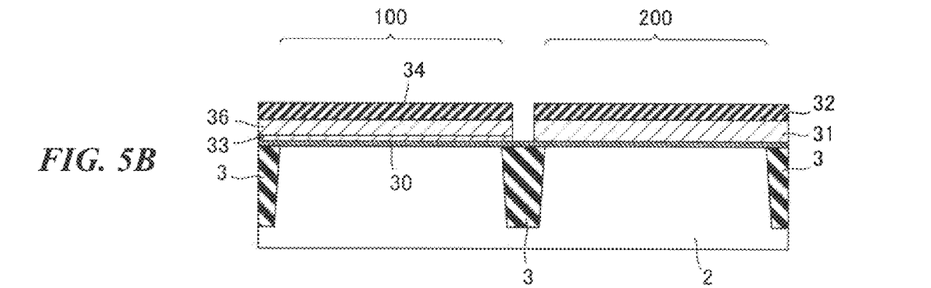

Next, as shown in FIG. 5B, the third metal film 36 and the second metal film 33 are etched using a mask material 34 formed on the third metal film 36 in the n-type MISFET region 100 as a mask, thereby removing the third metal film 36 and the second metal film 33 in the p-type MISFET region 200.

Here, the third metal film 36 and the second metal film 33 in the p-type MISFET region 200 are removed by a wet etching method, etc., using the mask material 34 as a mask.

Figure 5C:
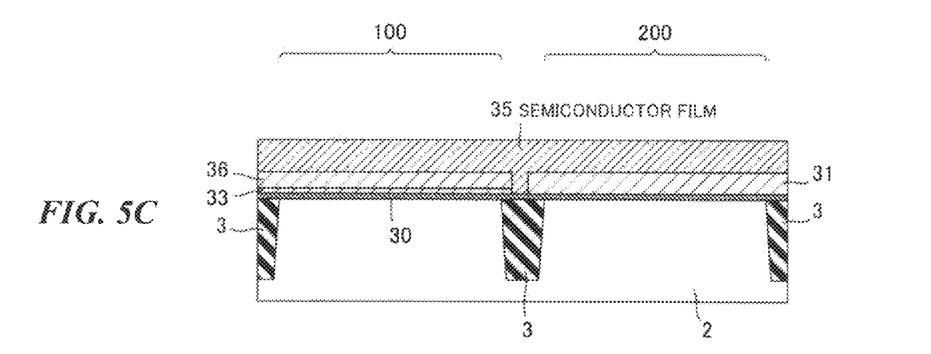

Next, as shown in FIG. 5C, after removing the mask materials 32 and 34, a semiconductor film 35 is formed on the third metal film 36 in the n-type MISFET region 100 and on the first metal film 31 in the p-type MISFET region 200.

Figure 5D:
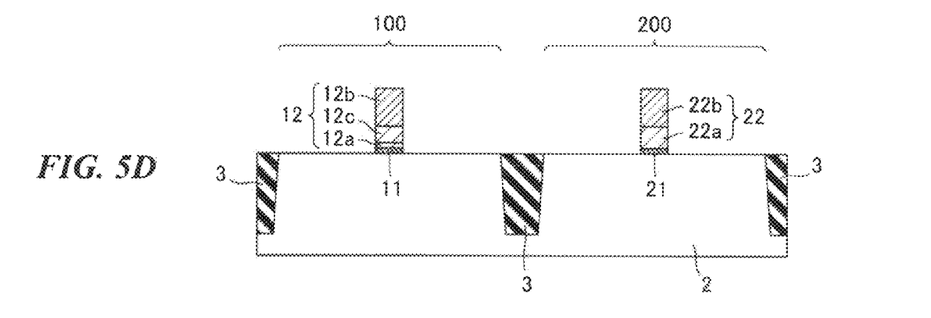

Next, as shown in FIG. 5D, the semiconductor film 35, the first metal film 31, the third metal film 36, the second metal film 33 and the insulating film 30 are patterned, which results in that the semiconductor layer 12b, the metal layer 12c, the metal layer 12a and the gate insulating film 11 are formed in the n-type MISFET region 100, and that the semiconductor layer 22b, the metal layer 22a and the gate insulating film 21 are formed in the p-type MISFET region 200. Note that, the gate electrode 12 is composed of the metal layer 12a, the metal layer 12c and the semiconductor layer 12b, and the gate electrode 22 is composed of the metal layer 22a and the semiconductor layer 22b.

Here, the semiconductor film 35, the first metal film 31, the third metal film 36, the second metal film 33 and the insulating film 30 are patterned by, e.g., the photolithography method and the RIE method. As a result of the patterning, the semiconductor film 35 is shaped into the semiconductor layers 12b and 22b, the first metal film 31 is shaped into the metal layer 22a, the third metal film 36 and the second metal film 33 are shaped into the metal layer 12c and the metal layer 12a, and the insulating film 30 is shaped into the gate insulating films 11 and 21.

At this time, since the first metal film 31, the third metal film 36 and the second metal film 33 are made of the same material or a material having the same constituent elements and the sum of the thicknesses of the second metal film 33 and the third metal film 36 is substantially equal to the thickness of the first metal film 31, time required for etching the third metal film 36 and the second metal film 33 is substantially equal to time required for etching the first metal film 31. Therefore, it is possible to simultaneously pattern the gate electrodes 12 and 22 using one photomask.

Subsequently, the processes after the process, shown in FIG. 3G, for forming the offset spacers 13, 23 and the extension regions of the source/drain regions 14 and 24 are carried out in the same way as the first embodiment.

Effect of the Second Embodiment

According to the second embodiment, similarly to the first embodiment, by differentiating the film thickness of the metal layer 12a from that of the metal layer 22a, it is possible to set threshold voltage respectively suitable for the n-type MISFET 10 and the p-type MISFET 20.

In addition, since it is possible to reduce application of other threshold voltage adjustment methods even in the case that it is not possible to obtain the desired threshold voltage only by adjusting the work function by controlling film thicknesses of the metal layers 12a and 22a, it is possible to reduce deterioration in operating characteristics of the n-type MISFET 10 and the p-type MISFET 20 caused by the other threshold voltage adjustment methods.

In addition, since the metal layers 12a, 12c and 22a are made of the same material or a material having the same constituent elements and the sum of the thicknesses of the metal layers 12a and 12c is substantially equal to the thickness of the metal layer 22a, it is possible to simultaneously pattern the gate electrodes 12 and 22 using one photomask.

Third Embodiment

The third embodiment is different from the first embodiment in that a semiconductor layer of the gate electrode 12 and a semiconductor layer of the gate electrode 22 include a compressive stress and respectively generate a strain in the channel regions 15 and 25. Note that, the explanations will be omitted or simplified for other points which are the same as the first embodiment.

Figure 6:
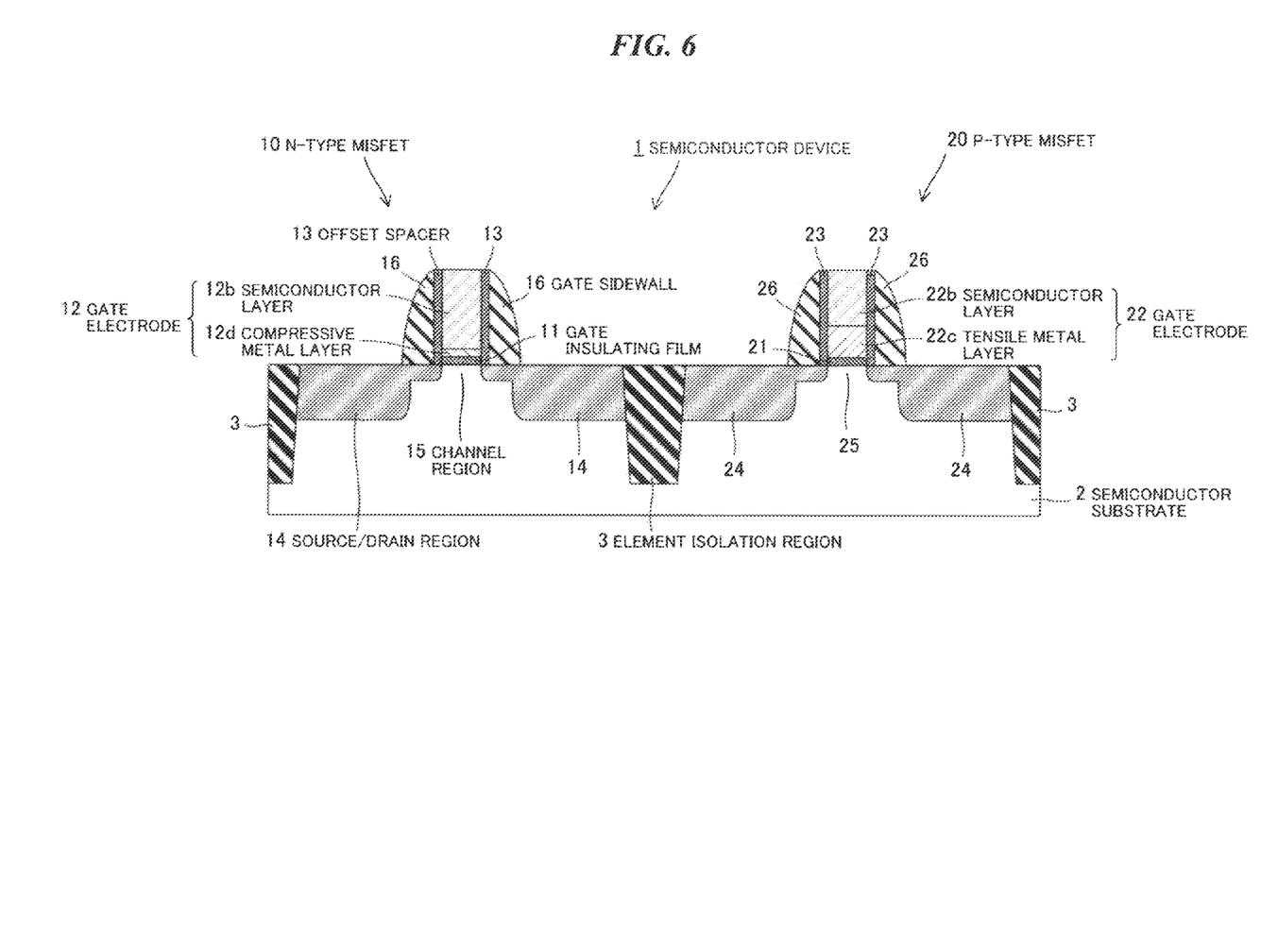
FIG. 6 is a cross sectional view showing a semiconductor device according to a third embodiment.

FIG. 6 is a cross sectional view showing a semiconductor device 1 according to a third embodiment.

The gate electrode 12 includes a compressive metal layer 12d formed on the gate insulating film 11 and a semiconductor layer 12b formed on the compressive metal layer 12d. Meanwhile, the gate electrode 22 includes a tensile metal layer 22c formed on the gate insulating film 21 and a semiconductor layer 22b formed on the tensile metal layer 22c.

The compressive metal layer 12d and the tensile metal layer 22c have a function as a metal gate for preventing depletion of the gate electrodes 12 and 22. The compressive metal layer 12d and the tensile metal layer 22c are made of, e.g., Ti, Ta, W, Mo or Ru, a nitride thereof or a carbide thereof, and further, a compound of those metals with Si (TiN, TaSiN or TaC, etc.).

The tensile metal layer 22c is thicker than the compressive metal layer 12d, and for the same reason as the first embodiment, the work function of the tensile metal layer 22c is larger than that of the compressive metal layer 12d. Thus, the threshold voltage suitable for an n-type MISFET is provided to the n-type MISFET 10 by the gate electrode 12 including the compressive metal layer 12d, and the threshold voltage suitable for a p-type MISFET is provided to the p-type MISFET 20 by the gate electrode 22 including the tensile metal layer 22c.

In addition, the compressive metal layer 12d and the tensile metal layer 22c are made of the same material or a material having the same constituent elements. Therefore, a relation between the film thickness and the work function is substantially equal between the compressive metal layer 12d and the tensile metal layer 22c, hence, adjustment of the work function of both layers is facilitated.

A thickness of the compressive metal layer 12d is preferably 2 nm or more in order to sufficiently ensure a function as a metal gate. In addition, the tensile metal layer 22c is preferably 5 nm or more thicker than the compressive metal layer 12d so that the compressive metal layer 12d and the tensile metal layer 22c have work functions respectively suitable for the n-type MISFET 10 and the p-type MISFET 20.

Alternatively, when it is not possible to obtain desired threshold voltage only by adjusting the work function by controlling film thicknesses of the compressive metal layer 12d and the tensile metal layer 22c, the threshold voltage may be compensatingly adjusted by other methods, such as implantation of an impurity such as La, Mg, Al or Ge, etc., into the gate insulating films 11 and 21. Also in this case, since it is possible to bring the threshold voltage closer to the desired value by controlling the film thickness, it is possible to reduce deterioration in operating characteristics of the n-type MISFET 10 and the p-type MISFET 20 caused by the other method (e.g., a decrease in carrier mobility caused by implantation of an impurity into the gate insulating films 11 and 21).

In addition, the compressive metal layer 12d includes a compressive stress, and generates a tensile strain in a channel direction in the channel region 15. A material film of the compressive metal layer 12d is formed so as to include a compressive stress. The compressive stress remains in the compressive metal layer 12d even after patterning and shaping the material film into the compressive metal layer 12d.

Meanwhile, the tensile metal layer 22c includes a tensile stress, and generates a compressive strain in a channel direction in the channel region 25. A material film of the tensile metal layer 22c is formed so as to include a tensile stress. The tensile stress remains in the tensile metal layer 22c even after patterning and shaping the material film into the tensile metal layer 22c.

In addition, even when the compressive metal layer 12d and the tensile metal layer 22c are made of the same material, it is possible to leave a stress in each appropriate direction by, e.g., forming the compressive metal layer 12d using the PVD method and forming the tensile metal layer 22c using the CVD method.

Note that, the processes for fabricating the semiconductor device 1 are the same as the first embodiment, except that the compressive metal layer 12d and the tensile metal layer 22c are formed instead of the metal layers 12a and 22a.

Effect of the Third Embodiment

According to the third embodiment, by differentiating the film thickness of the compressive metal layer 12d from that of the tensile metal layer 22c, it is possible to set threshold voltage respectively suitable for the n-type MISFET 10 and the p-type MISFET 20, similarly to the first embodiment.

In addition, since it is possible to reduce application of other threshold voltage adjustment methods even in the case that it is not possible to obtain the desired threshold voltage only by adjusting the work function by controlling film thicknesses of the compressive metal layer 12d and the tensile metal layer 22c, it is possible to reduce deterioration in operating characteristics of the n-type MISFET 10 and the p-type MISFET 20 caused by the other threshold voltage adjustment methods.

In addition, since the compressive metal layer 12d generates a tensile strain in a channel direction in the channel region 15, it is possible to improve electron mobility in the channel region 15, thereby improving operating characteristics of the n-type MISFET 10.

In addition, since the tensile metal layer 22c generates a tensile strain in a channel direction in the channel region 25, it is possible to improve hole mobility in the channel region 25, thereby improving operating characteristics of the p-type MISFET 20.

Alternatively, a metal film, which has the same thickness as the compressive metal layer 12d and is made of the same material as the tensile metal layer 22c or a material having the same constituent elements as that of the tensile metal layer 22c and includes a tensile stress, may be used instead of the compressive metal layer 12d. In this case, although it is not possible to improve the operating characteristics of the n-type MISFET 10 by generating a tensile strain in the channel region 15, since this metal film is formed using the same method as that of the tensile metal layer 22c (e.g., the CVD method), it is possible to form this metal film and the tensile metal layer 22c in the same chamber. In addition, since this metal film and the tensile metal layer 22c are made of the same material or a material having the same constituent elements by the same method (e.g., the CVD method), it is possible to stably control the work function of both layers.

Fourth Embodiment

The fourth embodiment is different from the third embodiment in that the n-type MISFET 10 has two laminated compressive metal layers. Note that, the explanations will be omitted or simplified for other points which are the same as the third embodiment.

Figure 7:
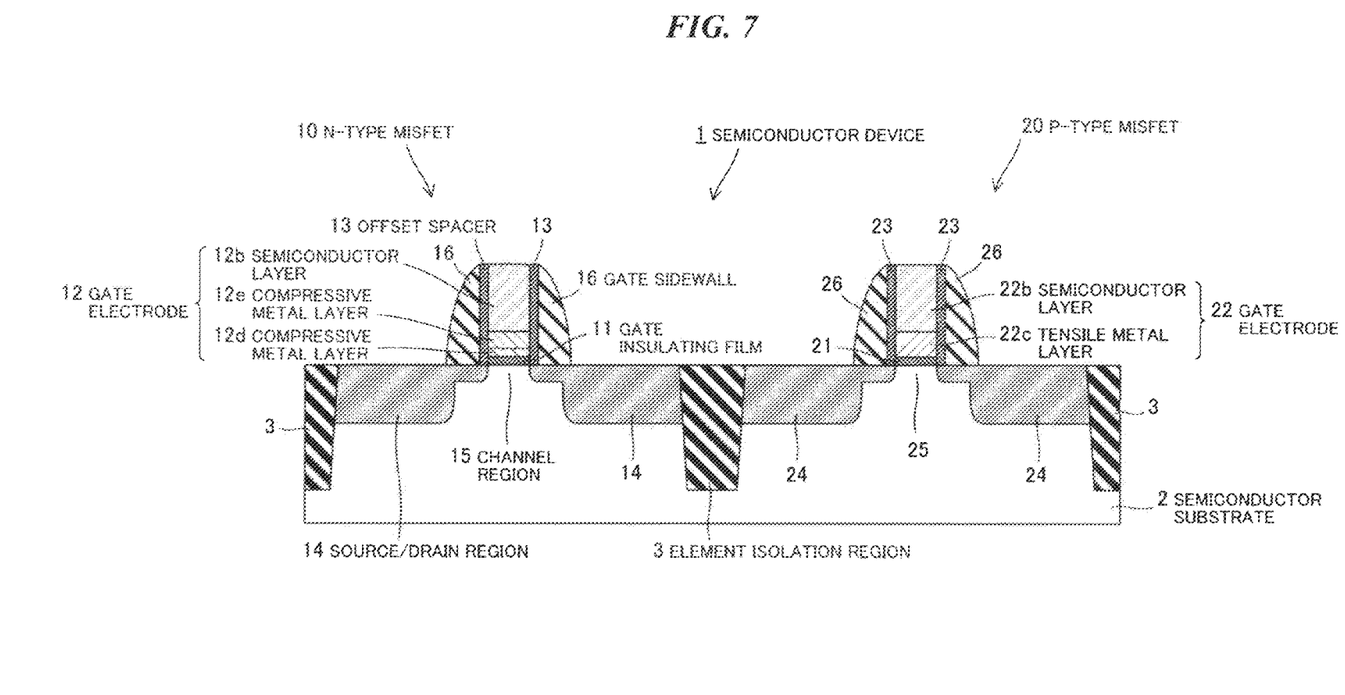
FIG. 7 is a cross sectional view showing a semiconductor device according to a fourth embodiment.

FIG. 7 is a cross sectional view showing a semiconductor device 1 according to a fourth embodiment.

The gate electrode 12 includes a compressive metal layer 12d formed on the gate insulating film 11, a compressive metal layer 12e formed on the compressive metal layer 12d and a semiconductor layer 12b formed on the compressive metal layer 12e. Meanwhile, the gate electrode 22 includes a tensile metal layer 22c formed on the gate insulating film 21 and a semiconductor layer 22b formed on the tensile metal layer 22c.

The compressive metal layer 12d and the tensile metal layer 22c have a function as a metal gate for preventing depletion of the gate electrodes 12 and 22. The compressive metal layers 12d, 12e and the tensile metal layer 22c are made of the same material or a material having the same constituent elements, and are made of, e.g., Ti, Ta, W, Mo or Ru, a nitride thereof or a carbide thereof, and further, a compound of those metals with Si (TiN, TaSiN or TaC, etc.).

The tensile metal layer 22c is thicker than the compressive metal layer 12d, and for the same reason as the first embodiment, the work function of the tensile metal layer 22c is larger than that of the compressive metal layer 12d. In addition, a sum of thicknesses of the compressive metal layers 12d and 12e is substantially equal to a thickness of the tensile metal layer 22c.

Comparing between the compressive metal layers 12d and 12e, the threshold voltage of the n-type MISFET 10 is largely affected by the work function of the compressive metal layer 12d which is an underlying layer. Thus, the threshold voltage suitable for an n-type MISFET is provided to the n-type MISFET 10 by the gate electrode 12 including the compressive metal layer 12d, and the threshold voltage suitable for a p-type MISFET is provided to the p-type MISFET 20 by the gate electrode 22 including the tensile metal layer 22c.

A thickness of the compressive metal layer 12d is preferably 2 nm or more in order to sufficiently ensure a function as a metal gate. In addition, the tensile metal layer 22c is preferably 5 nm or more thicker than the compressive metal layer 12d so that the compressive metal layer 12d and the tensile metal layer 22c have work functions respectively suitable for the n-type MISFET 10 and the p-type MISFET 20.

Alternatively, when it is not possible to obtain desired threshold voltage only by adjusting the work function by controlling film thicknesses of the compressive metal layer 12d and the tensile metal layer 22c, the threshold voltage may be compensatingly adjusted by other methods, such as implantation of an impurity such as La, Mg, Al or Ge, etc., into the gate insulating films 11 and 21. Also in this case, since it is possible to bring the threshold voltage closer to the desired value by controlling the film thickness, it is possible to reduce deterioration in operating characteristics of the n-type MISFET 10 and the p-type MISFET 20 caused by the other method (e.g., a decrease in carrier mobility caused by implantation of an impurity into the gate insulating films 11 and 21).

In addition, the compressive metal layers 12d and 12e include a compressive stress, and generate a tensile strain in a channel direction in the channel region 15. The compressive metal layers 12d and 12e are formed by, e.g., the PVD method. Note that, the compressive metal layer 12e may be a film which does not include a stress.

Note that, although the metal layer 12c may be composed of a multilayer metal film, since a strain generated in the channel region 15 is larger in a layer composed of one thick film than in a layer composed of laminated thin films, a single layer is preferable.

In addition, the tensile metal layer 22c includes a tensile stress, and generates a compressive strain in a channel direction in the channel region 25. The tensile metal layer 22c is formed by, e.g., the CVD method.

Note that, the processes for fabricating the semiconductor device 1 are the same as the second embodiment, except that the compressive metal layers 12d, 12e and the tensile metal layer 22c are respectively formed instead of the metal layers 12a, 12c and 22a.

Effect of the Fourth Embodiment

According to the fourth embodiment, similarly to the third embodiment, by differentiating the film thickness of the compressive metal layer 12d from that of the tensile metal layer 22c, it is possible to set threshold voltage respectively suitable for the n-type MISFET 10 and the p-type MISFET 20.

In addition, since it is possible to reduce application of other threshold voltage adjustment methods even in the case that it is not possible to obtain the desired threshold voltage only by adjusting the work function by controlling film thicknesses of the compressive metal layer 12d and the tensile metal layer 22c, it is possible to reduce deterioration in operating characteristics of the n-type MISFET 10 and the p-type MISFET 20 caused by the other threshold voltage adjustment methods.

In addition, since the compressive metal layers 12d and 12e generate a tensile strain in a channel direction in the channel region 15, it is possible to improve electron mobility in the channel region 15, thereby improving operating characteristics of the n-type MISFET 10.

In addition, since the tensile metal layer 22c generates a tensile strain in a channel direction in the channel region 25, it is possible to improve hole mobility in the channel region 25, thereby improving operating characteristics of the p-type MISFET 20.

In addition, since the compressive metal layers 12d, 12e and the tensile metal layer 22c are made of the same material or a material having the same constituent elements and the sum of the thicknesses of the compressive metal layers 12d and 12e is substantially equal to the thickness of the tensile metal layer 22c, it is possible to simultaneously pattern the gate electrodes 12 and 22 using one photomask.

Alternatively, a metal film, which has the same thickness as the compressive metal layer 12d and includes a tensile stress, may be used instead of the compressive metal layer 12d. In this case, although the tensile strain generated in the channel region 15 is decreased as compared with the case of using the compressive metal layer 12d, since this metal film is formed by the same method (e.g., the CVD method) as that of the tensile metal layer 22c, it is possible to stably control the work function of both layers.

Fifth Embodiment

The fifth embodiment is different from the fourth embodiment in that the n-type MISFET 10 has a tensile metal layer composed of plural laminated tensile metal films. Note that, the explanations will be omitted or simplified for other points which are the same as the fourth embodiment.

Figure 8:
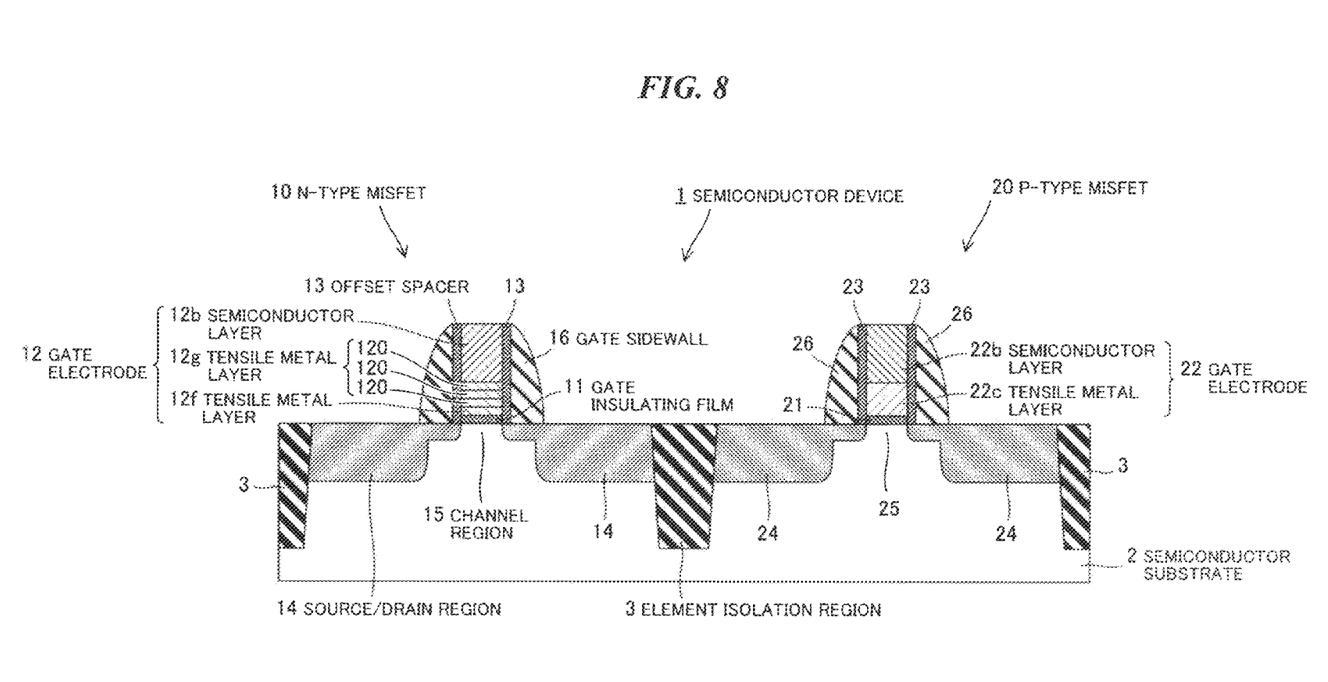
FIG. 8 is a cross sectional view showing a semiconductor device according to a fifth embodiment.

FIG. 8 is a cross sectional view showing a semiconductor device 1 according to a fifth embodiment.

The gate electrode 12 includes a tensile metal layer 12f formed on the gate insulating film 11, a tensile metal layer 12g composed of plural tensile metal films 120 laminated on the tensile metal layer 12f, and a semiconductor layer 12b formed on the tensile metal layer 12g. Meanwhile, the gate electrode 22 includes a tensile metal layer 22c formed on the gate insulating film 21 and a semiconductor layer 22b formed on the tensile metal layer 22c.

The tensile metal layers 12f and 22c have a function as a metal gate for preventing depletion of the gate electrodes 12 and 22. The tensile metal layers 12f, 12g and 22c are made of the same material or a material having the same constituent elements, and are made of, e.g., Ti, Ta, W, Mo or Ru, a nitride thereof or a carbide thereof, and further, a compound of those metals with Si (TiN, TaSiN or TaC, etc.).

The tensile metal layer 22c is thicker than the tensile metal layer 12f, and for the same reason as the first embodiment, the work function of the tensile metal layer 22c is larger than that of the tensile metal layer 12f. In addition, a sum of thicknesses of the tensile metal layers 12f and 12g is substantially equal to a thickness of the tensile metal layer 22c.

Comparing between the tensile metal layers 12f and 12g, the threshold voltage of the n-type MISFET 10 is largely affected by the work function of the tensile metal layer 12f which is an underlying layer. Thus, the threshold voltage suitable for an n-type MISFET is provided to the n-type MISFET 10 by the gate electrode 12 including the tensile metal layer 12f, and the threshold voltage suitable for a p-type MISFET is provided to the p-type MISFET 20 by the gate electrode 22 including the tensile metal layer 22c.

A thickness of the tensile metal layer 12f is preferably 2 nm or more in order to sufficiently ensure a function as a metal gate. In addition, the tensile metal layer 22c is preferably 5 nm or more thicker than the tensile metal layer 12f so that the tensile metal layers 12f and 22c have work functions respectively suitable for the n-type MISFET 10 and the p-type MISFET 20.

Alternatively, when it is not possible to obtain desired threshold voltage only by adjusting the work function by controlling film thicknesses of the tensile metal layers 12f and 22c, the threshold voltage may be compensatingly adjusted by other methods, such as implantation of an impurity such as La, Mg, Al or Ge, etc., into the gate insulating films 11 and 21. Also in this case, since it is possible to bring the threshold voltage closer to the desired value by controlling the film thickness, it is possible to reduce deterioration in operating characteristics of the n-type MISFET 10 and the p-type MISFET 20 caused by the other method (e.g., a decrease in carrier mobility caused by implantation of an impurity into the gate insulating films 11 and 21).

In addition, the tensile metal layer 12f and the tensile metal layer 12g (each tensile metal film 120 composing the tensile metal layer 12g) include a tensile stress, and generate a compressive strain in a channel direction in the channel region 15.

The tensile metal layer 12f and each tensile metal film 120 are formed by, e.g., the PVD method.

Here, a compressive strain in a channel direction generated in the channel region 15 is preferably small because that decrease carrier mobility in the channel region 15. Since the strain generated in the channel region 15 is smaller when forming the tensile metal layer 12g by laminating multiple thin films than by laminating few thick films, the number of the tensile metal films 120 composing the tensile metal layer 12g is preferably large.

In addition, the tensile metal layer 22c includes a tensile stress, and generates a compressive strain in a channel direction in the channel region 25. The tensile metal layer 22c is formed by, e.g., the CVD method.

Note that, the processes for fabricating the semiconductor device 1 are the same as the fourth embodiment, except that the tensile metal layers 12f and 12g are formed instead of the compressive metal layers 12d and 12e.

Effect of the Fifth Embodiment

According to the fifth embodiment, by differentiating the film thickness of the tensile metal layer 12f from that of the tensile metal layer 22c, it is possible to set threshold voltage respectively suitable for the n-type MISFET 10 and the p-type MISFET 20, similarly to the fourth embodiment.

In addition, since it is possible to reduce application of other threshold voltage adjustment methods even in the case that it is not possible to obtain the desired threshold voltage only by adjusting the work function by controlling film thicknesses of the tensile metal layers 12f and 22c, it is possible to reduce deterioration in operating characteristics of the n-type MISFET 10 and the p-type MISFET 20 caused by the other threshold voltage adjustment methods.

In addition, since the tensile metal layer 22c generates a tensile strain in a channel direction in the channel region 25, it is possible to improve hole mobility in the channel region 25, thereby improving operating characteristics of the p-type MISFET 20.

In addition, since the tensile metal layer 12f and the tensile metal layer 22c are made of the same material or a material having the same constituent elements by the same method (e.g., the CVD method), it is possible to stably control the work function of both layers.

In addition, since the tensile metal layers 12f, 12g and 22c are made of the same material or a material having the same constituent elements and the sum of the thicknesses of the tensile metal layers 12f and 12g is substantially equal to the thickness of the tensile metal layer 22c, it is possible to simultaneously pattern the gate electrodes 12 and 22 using one photomask.

In addition, since the tensile metal layers 12f and 12g are formed using the same method as that of the tensile metal layer 22c (e.g., the CVD method), it is possible to form tensile metal layers 12f, 12g and 22c in the same chamber.

Other Embodiments

It should be noted that the present invention is not intended to be limited to the above-mentioned first to fifth embodiments, and the various kinds of changes thereof can be implemented by those skilled in the art without departing from the gist of the invention.

For example, a layer made of another material having conductivity such as a metal may be used instead of the semiconductor layers 12b and 22b.

In addition, in each of the above-mentioned first to fifth embodiments, although it is explained that the metal layer 22a or the tensile metal layer 22c of the p-type MISFET 20 is a single layer, the metal layer 22a or the tensile metal layer 22c may be composed of a multilayer metal film.

In addition, the constituent elements of the above-mentioned embodiments can be arbitrarily combined with each other without departing from the gist of the invention.

What is claimed is:

1. A semiconductor device, comprising:
   an n-type transistor comprising a first gate electrode formed on a semiconductor substrate via a first gate insulating film, a first channel region formed in the semiconductor substrate under the first gate insulating film, and first source/drain regions formed in the semiconductor substrate on both sides of the first channel region, the first gate electrode comprising a first metal layer formed on the first gate insulating film to contact the first insulating film, and a first conductive layer on the first metal layer; and
   a p-type transistor comprising a second gate electrode formed on the semiconductor substrate via a second gate insulating film, a second channel region formed in the semiconductor substrate under the second gate insulating film, and second source/drain regions formed in the semiconductor substrate on both sides of the second channel region, the second gate electrode comprising a second metal layer formed on the second gate insulating film to contact the second insulating film, and a second conductive layer on the second metal layer, the second metal layer being thicker than the first metal layer and having the same constituent element as the first metal layer.

2. The semiconductor device according to claim 1, wherein the first metal layer comprises a metal film including a compressive stress; and
   the second metal layer comprises a metal film including a tensile stress.

3. The semiconductor device according to claim 1, wherein the first metal layer comprises a metal film including a tensile stress; and
   the second metal layer comprises a metal film including a tensile stress.

4. The semiconductor device according to claim 1, wherein the first and second conductive layers comprise a Si-based polycrystal.

5. The semiconductor device according to claim 1, wherein a work function of the second metal layer is larger than that of the first metal layer.

6. The semiconductor device according to claim 1, wherein the first metal layer is made of the same material as the second metal layer.

7. The semiconductor device according to claim 1, wherein the second metal layer is 5 nm or more thicker than the first metal layer.

8. The semiconductor device according to claim 1, wherein the first gate insulating film and the second gate insulating film are made of substantially same material and have a substantially same thickness.

9. The semiconductor device according to claim 1, wherein the first and second metal layers comprise Ti, Ta, W, Mo or Ru, a nitride thereof, a carbide thereof, or a compound of those metals with Si.

10. The semiconductor device according to claim 1, wherein a third metal layer comprising a material having the same constituent element as the first metal layer is formed between the first metal layer and the first conductive layer; and
    a sum of thicknesses of the first and third metal layers is substantially equal to a thickness of the second metal layer.

11. The semiconductor device according to claim 10, wherein the first metal layer comprises a metal film including a compressive stress; and
    the second metal layer comprises a metal film including a tensile stress.

12. The semiconductor device according to claim 10, wherein the first metal layer comprises a metal film including a tensile stress; and
    the second metal layer comprises a metal film including a tensile stress.

13. The semiconductor device according to claim 10, wherein the first and third metal layers comprise a metal film including a compressive stress; and
    the second metal layer comprises a metal film including a tensile stress.

14. The semiconductor device according to claim 10, wherein the first and second metal layers comprise a metal film including a tensile stress; and
    the third metal layer comprises a metal film including a compressive stress.

15. The semiconductor device according to claim 10, wherein the first and second metal layers comprise a metal film including a tensile stress; and
    the third metal layer comprises a metal laminated film being a plurality of laminated films including a tensile stress.

16. The semiconductor device according to claim 10, wherein the first and second conductive layers comprise a Si-based polycrystal.

17. The semiconductor device according to claim 10, wherein a work function of the second metal layer is larger than that of the first metal layer.

18. The semiconductor device according to claim 10, wherein the first metal layer is made of the same material as the second metal layer.

19. The semiconductor device according to claim 10, wherein the second metal layer is 5 nm or more thicker than the first metal layer.

20. The semiconductor device according to claim 10, wherein the first gate insulating film and the second gate insulating film are made of substantially same material and have a substantially same thickness.

* * * * *